United States Patent [19]

Yoshimoto et al.

[11] Patent Number: 5,049,409

[45] Date of Patent: Sep. 17, 1991

[54] METHOD FOR METAL OR METAL COMPOUNDS INSERTED BETWEEN ADJACENT GRAPHITE LAYERS

[75] Inventors: Yoshikazu Yoshimoto, Tenri; Tomonari Suzuki, Kashihara; Yoshiyuki Higashigaki, Kashiwa; Shigeo Nakajima, Nara; Toshio Inoguchi, Kashihara, all of Japan

[73] Assignee: Sharp Kabushiki Kaisha, Osaka, Japan

[21] Appl. No.: 344,961

[22] Filed: Apr. 28, 1989

Related U.S. Application Data

[60] Division of Ser. No. 190,353, May 5, 1988, Pat. No. 4,946,370, which is a continuation-in-part of Ser. No. 841,188, Mar. 19, 1986.

[30] Foreign Application Priority Data

| Mar. 20, 1985 [JP] | Japan | 56478 |
| Mar. 22, 1985 [JP] | Japan | 59275 |
| Mar. 26, 1985 [JP] | Japan | 64572 |

[51] Int. Cl.⁵ .............. C23C 16/18; C23C 16/26; C23C 16/46; B05D 5/12
[52] U.S. Cl. .................. 427/122; 427/249; 427/252; 427/255; 427/255.2
[58] Field of Search ............. 427/249, 255, 255.2, 427/122, 252

[56] References Cited

U.S. PATENT DOCUMENTS

| 2,901,381 | 8/1959 | Teal | 427/249 |
| 3,369,920 | 2/1968 | Bourdeau et al. | 427/249 |
| 3,464,843 | 9/1969 | Basche | 427/249 |
| 3,549,847 | 12/1970 | Clark et al. | 427/249 |
| 3,642,522 | 2/1972 | Gass et al. | 427/249 |
| 3,677,795 | 7/1972 | Bokros et al. | 427/249 |
| 3,721,577 | 3/1973 | Woerner | 427/249 |
| 3,814,625 | 6/1974 | Lewin et al. | 427/249 |
| 3,832,221 | 8/1974 | Ekemar | 427/249 |
| 4,701,317 | 10/1987 | Arakawa et al. | 427/249 |

FOREIGN PATENT DOCUMENTS

| 750329 | 1/1967 | Canada | 427/249 |
| 0142176 | 5/1985 | European Pat. Off. | |
| 60-238480 | 11/1985 | Japan | 427/249 |
| 967565 | 8/1964 | United Kingdom | 427/249 |
| 992047 | 5/1965 | United Kingdom | 427/249 |

OTHER PUBLICATIONS

Patent Abstracts of Japan 5848428.
Chemical Abstracts, vol. 77, No. 24, 155692r.
Chemical Abstracts, vol. 79, No. 18, 108938g, 108939h.
Chemical Abstracts, vol. 76, No. 8, 36882x.

*Primary Examiner*—Michael Lusignan
*Assistant Examiner*—Margaret Burke
*Attorney, Agent, or Firm*—Birch, Stewart, Kolasch & Birch

[57] ABSTRACT

A method for preparing a graphite intercalation compound having a metal or a metal compound inserted between adjacent graphite layers, comprising simultaneously introducing a mixture of a vapor of both a hydrocarbon compound and an organo metallic compound together with a carrier gas into a reactor, and decomposing said hydrocarbon compound and said organo metallic compound on a single-crystalline substrate at a relatively low temperature.

6 Claims, 1 Drawing Sheet

METHOD FOR METAL OR METAL COMPOUNDS INSERTED BETWEEN ADJACENT GRAPHITE LAYERS

This application is a divisional of co-pending application Ser. No. 07/190,353 filed on May 5, 1988, now U.S. Pat. No. 4,946,370, which in turn is a continuation-in-part of application Ser. No. 06/841,188 filed on Mar. 19, 1986.

BACKGROUND OF THE INVENTION

The present invention relates to a process for preparing a pyrolytic carbon film, a graphite intercalation compound and a doped carbon film.

Graphite unique properties associated with its layer structure such as anisotropies in thermal and electrical conductivity. However, the synthesis of graphite requires extreme conditions of pressure and temperature due to the fact that it has an inaccessible melting point and an extremely low sublimation pressure. For example, so called HOPG is prepared by decomposing a gaseous hydrocarbon (e.g. methane) at 2,000° C. and then hot pressing the resulting pyrolytic material at still a higher temperature. It is now well known that most carboneceous materials are graphitized when they are subjected to a heat treatment at temperatures above 2,500° C. On the other hand, there have been many efforts to prepare pyrolytic carbons, at low decomposition temperatures utilizing dehydrogenation, dehydrohalogenation, decarbonic acid, and the dehydration of selected hydrocarbons. However, the carbon deposits thus obtained are of such a poorly ordered state that they are insufficient to provide anisotropic materials or device made therefrom. There also been known carbon fibers which are obtained by the heat treatment of a fibrous polymer compound at high temperature. These carbon fibers are widely used for structural materials, but their instability in physical properties debases their usefulness for new electronic materials or devices utilizing anisotropic electrical and thermal conductivity. They also lack reproducibility.

To modify graphite leads to the establishment of a variety of degrees of anisotropy, there have been studied many kinds of graphite intercalation compounds (GIC) which are achieved by allowing metal atoms, metal halides or acids to be inserted between adjacent graphite layers of a host graphite material. However, the common method such as the two-zone vapor transport technique and the electrochemical reaction method, as well as other novel methods essentially achieved by direct contact of liquid or gaseous species with host graphite, was applied to such limited reagents that have a low melting point or a high vapor pressure. Most of these compounds with graphite elaborated by these methods are not only unstable but are also sensitive to heat. There has not been reported any air stable GIC in which the intercalant is fixed firmly, nor a practical utilization of the anisotropic properties involved in the new electronic device.

Impurity doping is another method of controlling the degree of anisotropy or the type of conductivity (P-type or N-type). But the fact that graphite is thermodynamically very stable refutes the diffusion technique often used in the fabrication of doped silicon or a germanium semiconductor. Accordingly, doped graphite has not been reported.

SUMMARY OF THE INVENTION

The present invention is directed to a method for preparing pyrolytic carbon films with a highly ordered graphite structure at relatively low temperature. The method comprises the thermal decomposition of organic compounds such as aromatic and unsaturated hydrocarbons introduced by a carrier gas into a reaction chamber to deposit the carbon films onto a single-crystalline substrate.

The present invention also is directed to a method for preparing intercalation compounds with metal or metal compounds. The method consists of the simultaneous thermal decomposition of two kinds of starting materials by a CVD (Chemical Vapor Deposition) method in which the hydrocarbon as a source material for the host graphite and the other organometallic reagents or metal halides for guest metal species or metal compounds are decomposed simultaneously in a reactor in order to intercalate the metal species or metal compound into the carbon being deposited on the substrate.

Further, the present invention is to provide a doped carbon film which is capable of P-type or N-type, depending upon the kind of dopant utilized. The doped film is obtained by partial substitution of dopants for carbon atoms which constitute graphite hexagonal net layer during the growth of carbon films, through simultaneous thermal decomposition of two kinds of source materials for carbon films and for dopant to be substituted.

BRIEF DESCRIPTION OF THE DRAWINGS

The present invention will become more fully understood from the following detailed description given here below and the accompanying Figures which are given by way of illustration only, and thus are not intended to be limitative of the present invention, and wherein.

DETAILED DESCRIPTION OF THE PRESENT INVENTION

Figure 1:
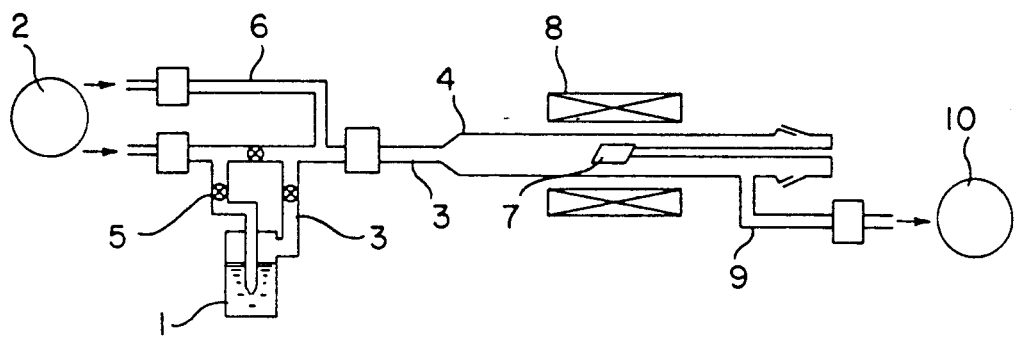
FIG. 1 shows a schematical view of an apparatus for preparing a pyrolytic carbon film according to the first embodiment of the present invention.

The hydrocarbons employed in the present invention as a starting material include hydrocarbons, preferably aromatic hydrocarbons, and unsaturated hydrocarbons, which are generally decomposable at approximately 1,000° C. Typical examples of the hydrocarbons are cyclohexane, n-hexane, benzene, biphenyl, anthracene, hexamethylbenzene, 1,2-dibromoethylene, 2-butyne, acetylene, diphenylacetylene and the like. The method for supplying the hydrocarbon varies depending on the kind of hydrocarbon, but includes bubbling method, the vaporization method, the sublimation method and the like. The regulated hydrocarbon is supplied at a constant rate of not more than 10 mmol/hour in order to prepare carbon films with metals. But the supply rates are not limited because they vary depending on the type of the hydrocarbon. Supply rates larger than 10 mmol/hour forms soot-like carbon deposit over the substrate. A build-up time of the pyrolytic carbon film is 0.1 to 10

μm/hour, preferably 0.1 to 2 μm/hour, more preferably 0.1 to 1 μm/hour.

The carrier gas used to introduce the above mentioned hydrocarbon into the reaction chamber is hydrogen or an inert gas, such as argon or nitrogen. When the bubbling method for supplying the hydrocarbon is employed, hydrogen or argon is preferably as the carrier gas.

For the preparation of graphite intercalation compounds or doped carbon films, another kind of starting material beside hydrocarbon is used. Examples of the source material for metal intercalant includes organo metallic compounds such as tetraphenyl tin and tetraphenyl lead. Examples of the source material for the dopant are boron tetrabromide and pyridine. The simultaneous thermal decomposition of these starting materials together with the starting material for the carbon film provides metal intercalant or dopant during the growth of the carbon films. The metal atoms of the organometal compound are believed to be inserted between adjacent graphite layers of carbon films being grown on the substrate. The dopant such as boron (P type) or nitrogen (N type) are partially substituted for carbon atoms which constitute the graphite hexagonal net layer during the growth of carbon films on the substrate.

The establishment of low temperature growth of pyrolytic carbon films provides practical utilization of its anisotropic properties to new electronic materials. The synthesis of air stable GIC in which the graphite is modified by intercalation provides still more important application due to a variety degree of anisotropy. Further, the present invention makes it possible that dopants are introduced into the graphite hexagonal net plane to provide doped carbon of the P-type or N-type.

The single-crystalline substrate which is deposited includes silicon, sapphire, silicon carbide (including alpha-type and beta-type), boron nitride, kish graphite, high orientation graphite and the like, which is required to have no modification at about 1,000° C.

PREFERRED EMBODIMENTS

The following examples illustrate the present invention, but they are not construed as limiting the present invention.

EXAMPLE 1

In FIG. 1, benzene is selected as a starting material and the bubbling method using argon as the carrier gas is employed for the preparation of pyrolytic carbon films. The low pressure CVD can also be achieved with the apparatus shown in FIG. 1. This method can provide carbon films in uniform thickness compared with the bubbling method under atmospheric pressure.

Benzene molecules are introduced to the bubbling method of the carrier gas into a quartz reaction tube 4 through a pyrex glass tube 3 from a feed stock 1 wherein benzene purified through vacuum distillation is accommodated. The supply rate of benzene is determined by valve 5 which regulates the flow rate of Ar bubbling gas in which benzene vapor is saturated. In order to supply benzene strictly at a constant rate of several mmol/hour, the present example was 1 mmol/hour, the feed stock is kept a constant temperature and the gas is further preregulated by regulator 7. The benzene partial concentration is controlled by another Ar gas flow through pyrex tube 6. A piece of single-crystalline substrate, placed at the center position on the pedestal 7, is heated up to 1,000° C. by the heating furnace 8 around the reaction tube 4. Thus benzene molecules led into the reaction tube 4 are thermally decomposed at 1,000° C. and the carbon deposit having metallic luster are formed on the single-crystalline substrate. The remaining vapor led to the reaction tube 4 is discharged outside 10 through a discharge pipe 9.

The density of carbon deposits obtained were determined to be $2.1 \pm 0.1$ g/cm$^2$ by the float method using a mixture of carbon tetrachloride and methane dibromide. Infrared spectrum of the carbon films did not show the existence of —CH, —CH$_2$ and —CH$_3$. Ordered structure of the deposited carbon film was evaluated by high speed reflective electron-beam diffraction (RHEED). Arcing of diffraction ring was observed (see ACTA CRYSTALLOGRAPHICA, vol. 12, (1959), pp. 382-384). When structure is not ordered, electric conductivity was $\rho_{11} = 2 \times 10^{-3}$ Ω·cm at a direction parallel to the substrate. When structure is highly ordered as seen in the present invention, electric conductivity was $\rho_{11} = 1 \times 10^{-3}$ to $5 \times 10^{-4}$ Ω·cm.

EXAMPLE 2

Figure 2:
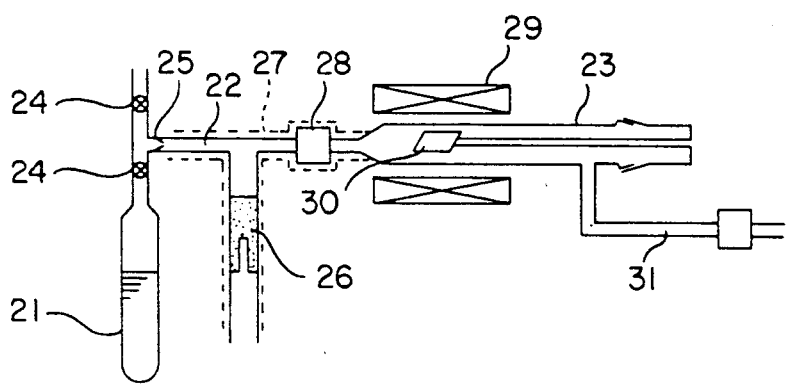
FIG. 2 shows a schematical view of the apparatus for preparing the graphite intercalation compound of the present invention.

A graphite intercalation compound was deposited by using the apparatus shown in FIG. 2.

Benzene was purified by vacuum distillation and stocked in a container 21. By opening a cock 24, the vapored benzene were introduced into a quartz reaction chamber 23 through a pyrex glass tube 22. The benzene supply was controlled by a glass capillary 25 which was equipped with the glass tube 22. The vapor of tetraphenyl tin was supplied from a container 6. It was admixed with the benzene vapor in the glass tube 22, and these were introduced into the reaction chamber 23 together. The glass tube 22 was wrapped with a heating tape 27 to keep its temperature constant. The glass tube 22 was connected with the quartz reaction chamber 23 with a connector 28. The reaction chamber 23 was inserted in a heater 29 and heated to a reaction temperature. A single crystal substrate was placed on a holder 10 in the reaction chamber. The remain of the vapor which had been introduced into the reaction tube 23 was drained through a drain tube 31.

Benzene whose supply rate was controlled by the capillary 25 and tetraphenyl tin were mixed and introduced into the reaction chamber 23 which was kept at 900° to 1,000° C. by the heater 29. The supply rate of the mixture was kept under a few mmol/hour. The benzene molecules which had been introduced to the reaction tubed 23 were thermally decomposed and formed a pyrolytic carbon which had metallic luster on the substrate. At the same time, tetraphenyl tin was also pyrolytically decomposed to insert tin atoms between the graphite-like carbon layers. A graphite intercalation compound is formed. The obtained film of the graphite intercalation compound possessed high crystallinity under the influence of the crystallinity of the substrate and showed the high orientation at a lower temperature than the conventional method. As the supply rate of benzene and tetraphenyl tin was kept constant, the grown film of graphite intercalation compound had a uniform thickness. It provides metal gloss and mirror surface together with the high crystallinity.

It has been confirmed by observing the X-ray image of tin using an electron microscopy the tin atoms have existed uniformly in the film of the graphite. By an X-ray diffraction of the obtained film of the graphite intercalation compound, a reflection corresponding to the sum of the atomic radius of tin and distance between the graphite layers was observed in addition to the reflection of the graphite (002).

In addition, the graphite intercalation compound could be also formed when tetraphenyl lead was used instead of tetraphenyl tin.

EXAMPLE 3

Figure 3:
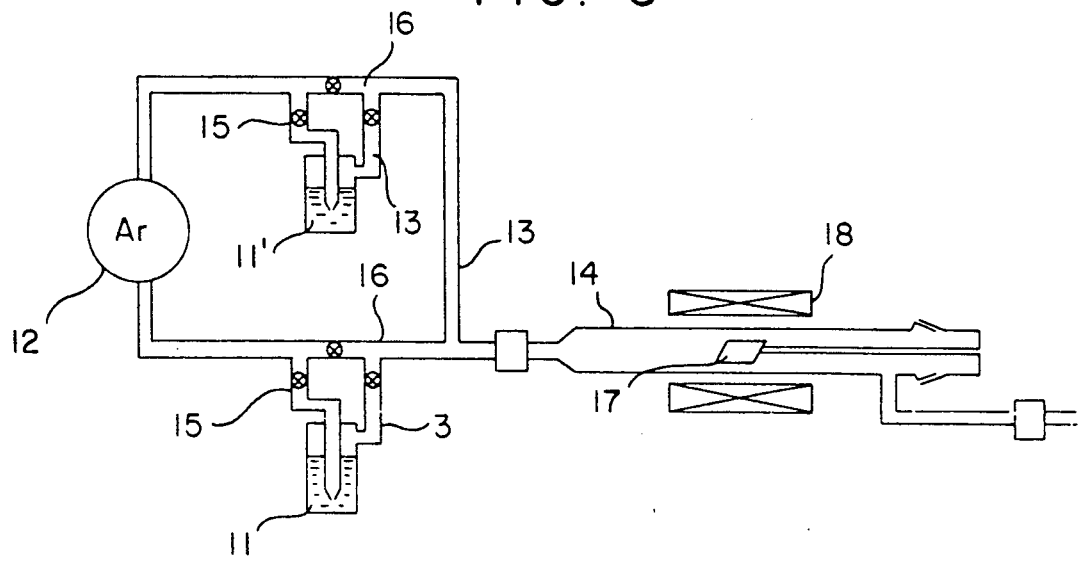
FIG. 3 shows a schematical view of the apparatus for preparing the doped carbon film of the present invention.

In FIG. 3, the bubbling method using Ar as carrier gas is employed for the preparation of doped carbon films. Benzene is selected as source material for carbon film and pyridine or boron tribromide is used as source material for nitrogen or boron dopant which will give N type or P type conductivity to carbon films.

The benzene purified through vacuum distillation is accommodated in a feed stock 11. In addition, starting materials for dopant purified through vacuum distillation is accommodated in a feed stock 11'. Both benzenes and source reagents for dopant are introduced at a same time into the reaction tube 14 through a pyrex glass tube 13 by bubbling method of the two Ar carrier gases which are regulated independently by valves 15. Supply rate of each material is controlled by each flow rate of Ar gas in which each vapor of starting materials is saturated. A piece of single-crystalline substrate, placed at the center position on the pedestal 17, is heated up to 1,000° C. by the heating furnace 18 around the reaction tube 14. Thus, the mixture of the two source materials led into the reaction tube 14 are decomposed simultaneously at 1,000° C. Then, the doped carbon films is obtained by partial substitution of dopants for carbon atoms during the growth of carbon films.

The existence of dopant element was confirmed by an Auger spectroscopy and the resistivity of the films varies depending on the amount of the dopant being existing.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for preparing a graphite intercalation compound having a metal or a metal compound inserted between adjacent graphite layers, comprising
   simultaneously introducing a mixture of a vapor of both a hydrocarbon compound and an organo metallic compound selected from at least one member of the group consisting of tetraphenyl tin and tetraphenyl lead together with a carrier gas into a reactor, and
   decomposing said hydrocarbon compound and said organo metallic compound on a single-crystalline substrate at a temperature within the range of from 900° to 1000° C.

2. The method according to claim 1, wherein said hydrocarbon compound is selected from at least one member of the group consisting of cholohexane, n-hexane, benzene, biphenyl, anthracene, hexamethylbenzene, 1,2-dibromoethylene, 2-butyne, acetylene and diphenylacetylene.

3. The method according to claim 2, wherein said hydrocarbon compound is benzene.

4. The method according to claim 1, wherein said carrier gas is selected from at least one member of the group consisting of argon and nitrogen.

5. The method according to claim 1, wherein said single-crystalline substrate is selected from at least one member of the group consisting of silicon, sapphire, silicon carbide, boron nitride, kish graphite and high orientation graphite.

6. The method according to claim 1, wherein said vapor and carrier gas mixture is introduced at a supply rate under a few mmol/hour.

* * * * *